US011308999B2

(12) United States Patent
Fujiwara et al.

(10) Patent No.: US 11,308,999 B2
(45) Date of Patent: *Apr. 19, 2022

(54) BOOST BYPASS CIRCUITRY IN A MEMORY STORAGE DEVICE

(71) Applicant: Taiwan Semiconductor Manufacturing Co., Ltd., Hsinchu (TW)

(72) Inventors: Hidehiro Fujiwara, Hsin-chu (TW); Yen-Huei Chen, Hsinchu County (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/128,831

(22) Filed: Dec. 21, 2020

(65) Prior Publication Data
US 2021/0183418 A1 Jun. 17, 2021

Related U.S. Application Data

(63) Continuation of application No. 16/502,596, filed on Jul. 3, 2019, now Pat. No. 10,872,644.
(Continued)

(51) Int. Cl.
*G11C 7/12* (2006.01)
*G11C 5/14* (2006.01)
(Continued)

(52) U.S. Cl.
CPC ................ *G11C 7/12* (2013.01); *G11C 5/145* (2013.01); *G11C 7/08* (2013.01); *G11C 7/109* (2013.01);
(Continued)

(58) Field of Classification Search
CPC ......... G11C 7/12; G11C 5/145; G11C 7/1069; G11C 7/109; G11C 7/1096; G11C 7/1063;
(Continued)

(56) References Cited

U.S. PATENT DOCUMENTS 5,999,039 A * 12/1999 Holst ........................ G11C 7/12
327/532
6,178,122 B1 * 1/2001 Tomishima .............. G11C 8/08
365/185.11
(Continued)

FOREIGN PATENT DOCUMENTS

KR 20170096391 A 8/2017

*Primary Examiner* — Michael T Tran
(74) *Attorney, Agent, or Firm* — Sterne, Kessler, Goldstein & Fox P.L.L.C.

(57) ABSTRACT

The present disclosure describes various exemplary memory storage devices that can be programmed to bypass one or more memory cells in a bypass mode of operation. The various exemplary memory storage devices can adjust, for example, pull-up or pull-down, the electronic data as the electronic data passes through these exemplary memory storage devices in the bypass mode of operation. In some situations, the various exemplary memory storage devices may introduce an unwanted bias into the electronic data as the electronic data passes through these exemplary memory storage devices in the bypass mode of operation. The various exemplary memory storage devices can pull-down the electronic data and/or pull-up the electronic data as the electronic data is passing through these exemplary memory storage devices in the bypass mode of operation to compensate for this unwanted bias.

20 Claims, 9 Drawing Sheets

Related U.S. Application Data

(60) Provisional application No. 62/697,667, filed on Jul. 13, 2018.

(51) Int. Cl.
  *H03K 19/003* (2006.01)
  *G11C 7/10* (2006.01)
  *G11C 7/08* (2006.01)

(52) U.S. Cl.
  CPC .......... *G11C 7/1063* (2013.01); *G11C 7/1069* (2013.01); *G11C 7/1096* (2013.01); *H03K 19/00384* (2013.01)

(58) Field of Classification Search
  CPC .. G11C 7/08; G11C 5/147; G11C 7/18; G11C 7/1051; G11C 7/1078; G11C 7/065; H03K 19/00384
  USPC .................................................. 365/203, 205
  See application file for complete search history.

(56) References Cited

U.S. PATENT DOCUMENTS

| | | | |
|---|---|---|---|
| 6,249,462 B1 | 6/2001 | Tanaka et al. | |
| 9,236,116 B1 | 1/2016 | Braceras et al. | |
| 9,899,834 B1* | 2/2018 | Mayo | G11C 5/143 |
| 10,079,062 B2 | 9/2018 | Kashihara | |
| 10,679,681 B1 | 6/2020 | Wu | |
| 2002/0118568 A1 | 8/2002 | Tanzawa | |
| 2003/0058722 A1* | 3/2003 | Park | G11C 7/06 |
| | | | 365/205 |
| 2004/0027850 A1 | 2/2004 | Kang | |
| 2004/0109340 A1* | 6/2004 | Kang | G11C 11/22 |
| | | | 365/145 |
| 2009/0073782 A1 | 3/2009 | Hanafi et al. | |
| 2009/0147604 A1 | 6/2009 | Kang | |
| 2011/0141830 A1 | 6/2011 | Chi et al. | |
| 2013/0155789 A1 | 6/2013 | Kim | |
| 2013/0286717 A1 | 10/2013 | Adams et al. | |
| 2013/0343143 A1 | 12/2013 | Jung | |
| 2014/0029346 A1* | 1/2014 | Tanzawa | G11C 5/145 |
| | | | 365/185.18 |
| 2015/0155017 A1 | 6/2015 | Garni et al. | |
| 2015/0364166 A1* | 12/2015 | Im | G11C 7/08 |
| | | | 365/189.11 |
| 2016/0247555 A1 | 8/2016 | Nguyen et al. | |
| 2016/0247556 A1* | 8/2016 | Jeong | G11C 7/12 |
| 2017/0125091 A1 | 5/2017 | Yoon et al. | |
| 2017/0133084 A1 | 5/2017 | Hwang | |
| 2017/0236573 A1 | 8/2017 | Kim | |
| 2018/0137920 A1 | 5/2018 | Song et al. | |
| 2018/0358101 A1 | 12/2018 | So et al. | |
| 2019/0108872 A1 | 4/2019 | Gupta et al. | |
| 2019/0214157 A1 | 7/2019 | Won et al. | |
| 2019/0237114 A1 | 8/2019 | Won et al. | |
| 2019/0385657 A1 | 12/2019 | Augustine et al. | |
| 2020/0020371 A1 | 1/2020 | Fujiwara et al. | |
| 2020/0161966 A1* | 5/2020 | de Santis | G11C 5/145 |
| 2020/0185010 A1 | 6/2020 | Lo et al. | |
| 2020/0211655 A1 | 7/2020 | Shibata et al. | |
| 2020/0241390 A1 | 7/2020 | Kwon et al. | |

\* cited by examiner

BOOST BYPASS CIRCUITRY IN A MEMORY STORAGE DEVICE

CROSS-REFERENCE TO RELATED APPLICATIONS

The present application is a continuation of U.S. patent application Ser. No. 16/502,596, filed Jul. 3, 2019, now U.S. Pat. No. 10,872,644, which claims the benefit of U.S. Provisional Patent Appl. No. 62/697,667, filed Jul. 13, 2018, which is incorporated herein by reference in its entirety.

BACKGROUND

A memory storage device is an electronic device for reading and/or writing electronic data. The memory storage device includes an array of memory cells which can be implemented as volatile memory cells, such as random-access memory (RAM) cells, which require power to maintain its stored information, or non-volatile memory cells, such as read-only memory (ROM) cells, which can maintain its stored information even when not powered. The electronic data can be read from and/or written into the array of memory cells which can be accessible through various control lines. The two basic operations performed by the memory storage device are "read", in which the electronic data stored in the array of memory cells is read out, and "write" in which the electronic data is written in the array of memory cells. During this write mode of operation, the memory storage device charges, also referred to as pre-charges, various control lines of the array of memory cells to write the data in the array of memory cells. However, in some situations, one or more unwanted leakage pathways within the memory storage device can prematurely discharge the various control lines of the array of memory cells before the data is written into the array of memory cells. In these situations, the one or more unwanted leakage pathways can undesirably alter the data which is being written into the array of memory cells. Often times, the memory storage device is required to operate using more power and/or at slower speeds to compensate for the one or more unwanted leakage pathways.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
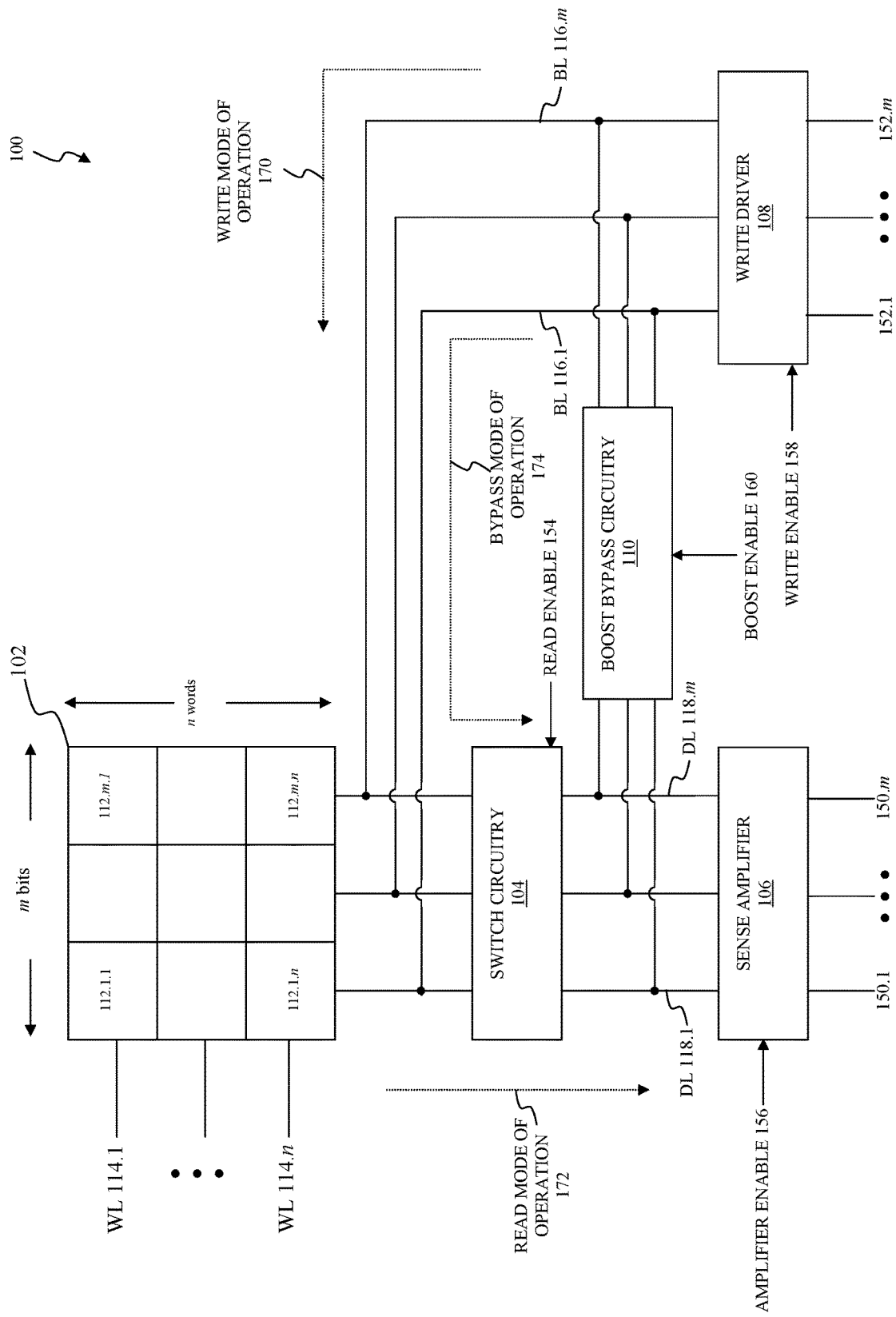
FIG. 1 illustrates a block diagram of an exemplary memory storage device according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations described.

Overview

The present disclosure describes various exemplary memory storage devices that can be programmed to bypass one or more memory cells in a bypass mode of operation. The various exemplary memory storage devices can adjust, for example, pull-up or pull-down, the electronic data as the electronic data passes through these exemplary memory storage devices in the bypass mode of operation. In some situations, the various exemplary memory storage devices may introduce an unwanted bias into the electronic data as the electronic data passes through these exemplary memory storage devices in the bypass mode of operation. The various exemplary memory storage devices can pull-down the electronic data and/or pull-up the electronic data as the electronic data is passing through these exemplary memory storage devices in the bypass mode of operation to compensate for this unwanted bias.

Exemplary Memory Storage Device

FIG. 1 illustrates a block diagram of an exemplary memory storage device according to an exemplary embodiment of the present disclosure. A memory storage device 100 can be programmed to write electronic data into one or more memory cells in a write mode of operation 170 and/or to read the electronic data from the one or more memory cells in a read mode of operation 172. Moreover, the memory storage device 100 can be programmed to bypass the one or more memory cells in a bypass mode of operation 174. In the exemplary embodiment illustrated in FIG. 1, the memory storage device 100 can adjust, for example, pull-up or pull-down, the electronic data as the electronic data passes through the memory storage device 100 in the bypass mode of operation 174.

As to be discussed in further detail below, the memory storage device 100 may introduce an unwanted bias into the electronic data as the electronic data passes through the memory storage device 100 in the bypass mode of operation 174. Ideally, the electronic data, when at a first logical value, such as a logical zero, should be at a voltage level approximating a minimum potential of the memory storage device 100, and/or when at a second logical value, such as a logical one, should be at a voltage level approximating a maximum potential of the memory storage device 100 when passing through the memory storage device 100 in the bypass mode of operation 174. However, in practice, the memory storage device 100 can introduce the unwanted bias into the electronic data causing the electronic data to be at an intermediate voltage level greater than the minimum potential and/or less than the maximum. In the exemplary embodiment illustrated in FIG. 1, the memory storage device 100 can pull-down the electronic data to the minimum potential and/or pull-up the electronic data to the maximum potential as the electronic data is passing through the memory storage device 100 in the bypass mode of operation 174 to compensate for this unwanted bias.

In the exemplary embodiment illustrated in FIG. 1, the memory storage device 100 can be implemented as a volatile memory storage device, such as a random-access memory (RAM) storage device to provide an example, which requires power to maintain the electronic data, or a non-volatile memory storage device, such as a read-only memory (ROM) storage device to provide an example, which can maintain the electronic data even when not powered. The RAM storage device can be implemented in a dynamic random-access memory (DRAM), a static random-access memory (SRAM), and/or a non-volatile random-access memory (NVRAM), often referred to as a flash memory, configuration to provide some examples. The ROM storage device can be implemented in programmable read-only memory (PROM), a one-time programmable ROM (OTP), an erasable programmable read-only memory (EPROM) and/or an electrically erasable programmable read-only memory (EEPROM) configuration to provide some examples. As illustrated in FIG. 1, the memory storage device 100 includes a memory array 102, switch circuitry 104, a sense amplifier 106, a write driver 108, and boost bypass circuitry 110. Moreover, although not illustrated in FIG. 1, the memory storage device 100 can include other electronic circuitry, such as a row-address decoder and/or a column-address decoder to provide some examples, which will be apparent to those skilled in the relevant art(s) without departing from the spirit and scope of the present disclosure.

As illustrated in FIG. 1, the memory storage device 100 can be programmed to operate in the write mode of operation 170, the read mode of operation 172, and/or the bypass mode of operation 174. In the write mode of operation 170, the write driver 108 is activated to allow input data bits 152.1 through 152.*m* to be written to the memory array 102. In the write mode of operation 170, the switch circuitry 104 and the boost bypass circuitry 110 are deactivated. In the read mode of operation 172, the switch circuitry 104 is activated to electronically couple the memory array 102 and the sense amplifier 106 to provide electronic data stored in the memory array 102 to output data bits 150.1 through 150.*m*. In the read mode of operation 172, the write driver 108 and the boost bypass circuitry 110 are deactivated. In the bypass mode of operation 174, the switch circuitry 104, the sense amplifier 106, the write driver 108, and the boost bypass circuitry 110 are activated to allow the input data bits 152.1 through 152.*m* to be passed onto the output data bits 150.1 through 150.*m*. In the bypass mode of operation 174, the memory array 102 is bypassed by the input data bits 152.1 through 152.*m*. As illustrated in FIG. 1, the write driver 108 does not write the input data bits 152.1 through 152.*m* into the memory array 102 in the bypass mode of operation 174. Rather, the write driver 108 passes the input data bits 152.1 through 152.*m* onto the switch circuitry 104 for delivery to the sense amplifier 106.

In the exemplary embodiment illustrated in FIG. 1, the memory array 102 includes memory cells 112.1.1 through 112.*m.n* that are configured into an array of m columns and n rows. However, other arrangements for the memory cells 112.1.1 through 112.*m.n* are possible without departing from the spirit and scope of the present disclosure. As illustrated in FIG. 1, the memory cells 112.1.1 through 112.*m.n* are connected to corresponding wordlines (WLs) from among WLs 114.1 through 114.*n* and corresponding bitlines (BLs) from among BLs 116.1 through 116.*m*. In an exemplary embodiment, the BLs 116.1 through 116.*m* as shown in FIG. 1 include BLs 116.1 through 116.*m* and complementary BLs 116.1 through 116.*m*. As additionally illustrated in FIG. 1, the memory cells 112.1.1 through 112.*m.n* in each of them columns of the memory array 102 share a common BL from among the BLs 116.1 through 116.*m*. Similarly, the memory cells 112.1.1 through 112.*m.n* in each of n rows of the memory array 102 share a common WL from among the WLs 114.1 through 114.*n*. For example, as illustrated in FIG. 1, the memory cells 112.1.1 through 112.*m.1* of row one of the memory array 102 share the WL 114.1 and the memory cells 104.*m.1* through 104.*m.n* of column m of the memory array 102 share the BL 116.*m*.

As illustrated in FIG. 1, the switch circuitry 104 electrically couples the BLs 116.1 through 116.*m* to corresponding data lines (DL) from among DLs 118.1 through 118.*m* in the read mode of operation 172 and/or in the bypass mode of operation 174. In the read mode of operation 172, the switch circuitry 104 electrically couples the memory array 102 to the sense amplifier 106. Otherwise, the switch circuitry 104 electrically decouples the memory array 102 from the sense amplifier 106 in the write mode of operation 170 to electrically isolate the memory array 102 from the sense amplifier 106. In the exemplary embodiment illustrated in FIG. 1, the switch circuitry 104 electrically couples the BLs 116.1 through 116.*m* to their corresponding data lines (DL) from among DLs 118.1 through 118.*m* in response to a read enable control signal 154 being at the first logical value, such as the logical zero, and electrically decouples the BLs 116.1 through 116.*m* to their corresponding data lines (DL) from among DLs 118.1 through 118.*m* in response to the read enable control signal 154 being at a second logical value, such as a logical one. In an exemplary embodiment, the switch circuitry 104 is implemented using p-type metal-oxide-semiconductor field-effect (PMOS) transistors.

In the exemplary embodiment illustrated in FIG. 1, the sense amplifier 106 reads the DLs 118.1 through 118.*m* from the memory array 102 to provide corresponding output data bits 150.1 through 150.*m* in the read mode of operation 172. In the exemplary embodiment illustrated in FIG. 1, the sense amplifier 106 is activated to read the electronic data in response to an amplifier enable control signal 156 being at the first logical value, such as the logical zero, in the read mode of operation 172 and in the bypass mode of operation 174. Otherwise, the sense amplifier 106 is deactivated in response to the amplifier enable control signal 156 being at the second logical value, such as the logical one, in the write mode of operation 170. As described above, the BLs 116.1 through 116.m include the BLs 116.1 through 116.m and the complementary BLs $\overline{116.1}$ through $\overline{116.m}$. Similarly, the DLs 118.1 through 118.m include DLs 118.1 through 118.m and complementary $\overline{DLs}$ $\overline{118.1}$ through $\overline{118.m}$. In the exemplary embodiment illustrated in FIG. 1, the sense amplifier 106 compares differences, also referred to as read margins (RMs), between the DLs 118.1 through 118.m and their corresponding complementary $\overline{DLs}$ $\overline{118.1}$ through $\overline{118.m}$ to determine whether first logical values, such as the logical zeros, or second logical values, such as logical ones, are stored within their corresponding memory cells 112.1.1 through 112.m.n. The sense amplifier 106 provides the first logical values, such as the logical zeros, to those data bits from among the output data bits 150.1 through 150.m whose $\overline{DLs}$ $\overline{118.1}$ through $\overline{118.m}$ are greater than their corresponding complementary DLs 118.1 through 118.m or provides the second logical values, such as a logical ones, to those data bits from among the output data bits 150.1 through 150.m whose DLs 118.1 through 118.m are less than their corresponding complementary $\overline{DLs}$ $\overline{118.1}$ through $\overline{118.m}$.

The write driver 108 provides the input data bits 152.1 through 152.m to corresponding BLs from among the BLs 116.1 through 116.m in the write mode of operation 170 and in the bypass mode of operation 174. In the exemplary embodiment illustrated in FIG. 1, the write driver 108 is activated to provide the electronic data in response to a write enable control signal 158 being at the first logical value, such as the logical zero, in the write mode of operation 170 and in the bypass mode of operation 174. Otherwise, the write driver 108 is deactivated in response to the write enable control signal 158 being at the second logical value, such as the logical one, in the read mode of operation 172. In an exemplary embodiment, the write driver 108 can be implemented using PMOS transistors to couple the BLs 116.1 through 116.m to a first potential of the memory storage device 100, such as an operational voltage supply $V_{DD}$, when their corresponding data bits from among the input data bits 152.1 through 152.m are at the first logical values, such as the logical zeros. In this exemplary embodiment, the write driver 108 can be implemented using n-type metal-oxide-semiconductor field-effect (NMOS) transistors to couple the BLs 116.1 through 116.m to a second potential, such as a ground potential to provide an example, when their corresponding data bits from among the input data bits 152.1 through 152.m are at the second logical values, such as the logical ones. In another exemplary embodiment, the write driver 108 can be implemented using the PMOS transistors to couple the BLs 116.1 through 116.m to a second potential of the memory storage device 100, such as a ground potential, when their corresponding data bits from among the input data bits 152.1 through 152.m are at the first logical values, such as the logical zeros. In this other exemplary embodiment, the write driver 108 can be implemented using the NMOS transistors to couple the BLs 116.1 through 116.m to a second potential, such as an operational voltage supply $V_{DD}$ to provide an example, when their corresponding data bits from among the input data bits 152.1 through 152.m are at the second logical values, such as the logical ones. In this other exemplary embodiment, the BLs 116.1 through 116.m can be characterized as being complementary to their corresponding input data bits 152.1 through 152.m.

The boost bypass circuitry 110 can adjust, for example, pull-up and/or pull-down, the DLs 118.1 through 118.m to match their corresponding input data bits 152.1 through 152.m in the bypass mode of operation 174. In some situations, the switch circuitry 104, when activated, can introduce unwanted bias into the electronic data as the electronic data passes from the BLs 116.1 through 116.m onto their corresponding DLs 118.1 through 118.m. For example, the BLs 116.1 through 116.m are at a minimum potential when at the first logical value, such as the logical zero, or at a maximum potential when at the second logical value, such as the logical one. In this example, the switch circuitry 104 introduces the unwanted bias into the electronic data causing the DLs 118.1 through 118.m to be at a first intermediate voltage level greater than the minimum potential when at the first logical value, such as the logical zero, or at a second intermediate voltage level less than the maximum potential when at the second logical value, such as the logical one. This unwanted bias introduced by the switch circuitry 104 decreases the difference, namely, a read margin (RM), between the first logical value, such as the logical zero, and the second logical value, such as the logical one. In these situations, the boost bypass circuitry 110, when activated, decreases the electronic data on the DLs 118.1 through 118.m, when at the first logical value, such as the logical zero, from the first intermediate voltage level to the minimum potential to increase the RM between the first logical value, such as the logical zero, and the second logical value, such as the logical one. For example, as to be described in further detail below in FIG. 2A, the boost bypass circuitry 110 includes one or more logical gates, such as one or more logical AND gates, one or more logical OR gates, one or more logical INVERTER gates, one or more logical NAND gates, one or more logical NOR gates, and/or one or more logical XOR gates to provide some examples, to pull-down the input data bits 152.1 through 152.m to the minimum potential when at the first logical value. In this example, the boost bypass circuitry 110 includes one or more switching elements, such as one or more PMOS transistors, one or more NMOS transistors, and/or one or more transmission gates, to provide some examples to electrically couple the input data bits 152.1 through 152.m to the DLs 118.1 through 118.m to pull-down the DLs 118.1 through 118.m to the minimum potential when at the first logical value. Alternatively, or in addition to, the boost bypass circuitry 110, when activated, increases the electronic data on the DLs 118.1 through 118.m, when at the second logical value, such as the logical one, from the second intermediate voltage level to the maximum potential to increase the RM between the first logical value, such as the logical zero, and the second logical value, such as the logical one. For example, as to be described in further detail below in FIG. 2A, the boost bypass circuitry 110 includes one or more logical gates, such as one or more logical AND gates, one or more logical OR gates, one or more logical INVERTER gates, one or more logical NAND gates, one or more logical NOR gates, and/or one or more logical XOR gates to provide some examples, to pull-up the input data bits 152.1 through 152.m to the maximum potential when at the second logical value. In this example, the boost bypass circuitry 110 includes one or more switching elements, such as one or more PMOS transistors, one or more NMOS transistors, and/or one or more transmission gates, to provide some examples to electrically couple the input data bits 152.1 through 152.m to the DLs 118.1 through 118.m to pull-up the DLs 118.1 through 118.m to the maximum potential when at the second logical value. In the exemplary embodiment illustrated in FIG. 1, the boost bypass circuitry 110 is activated to adjust the electronic data in response to a boost enable control signal 160 being at the first logical value, such as the logical zero, in the bypass mode of operation 174. Otherwise, the boost bypass circuitry 110 is deactivated in response to the boost enable control signal 160 being at the second logical value, such as the logical one, in the write mode of operation 170 and/or the read mode of operation 172.

Exemplary Implementations of the Exemplary Memory Storage Device

The description of FIG. 2A through FIG. 5 to follow describes various exemplary implementations for the memory storage device 100. These exemplary implementations are not limiting. Rather, those skilled in relevant art(s) will recognize other implementations for the memory storage device 100 are possible without departing from the spirit and scope of the present disclosure.

Figure 2A:
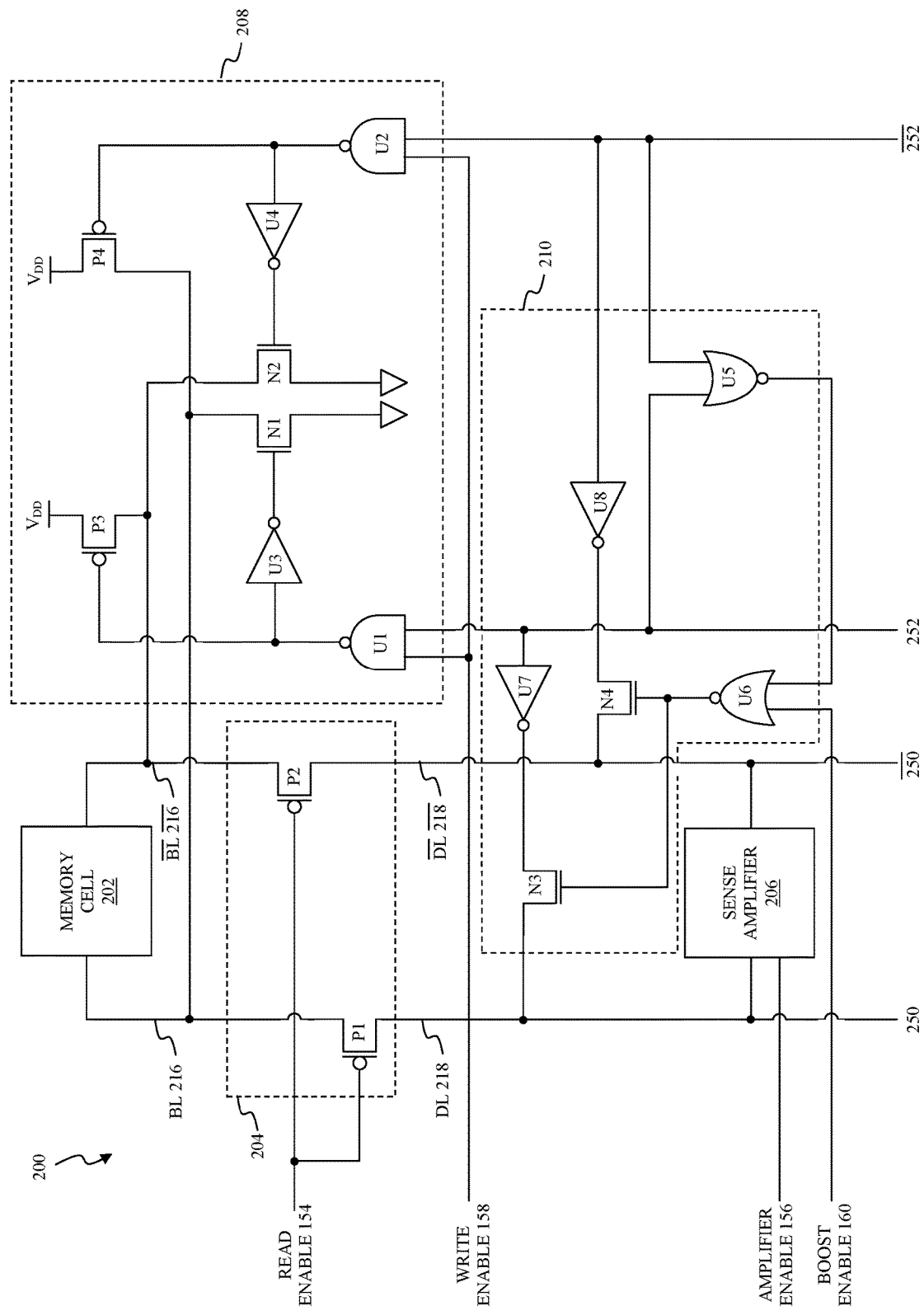
FIG. 2A illustrates a block diagram of a first exemplary implementation for the exemplary memory storage device according to an exemplary embodiment of the present disclosure.
Figure 2B:
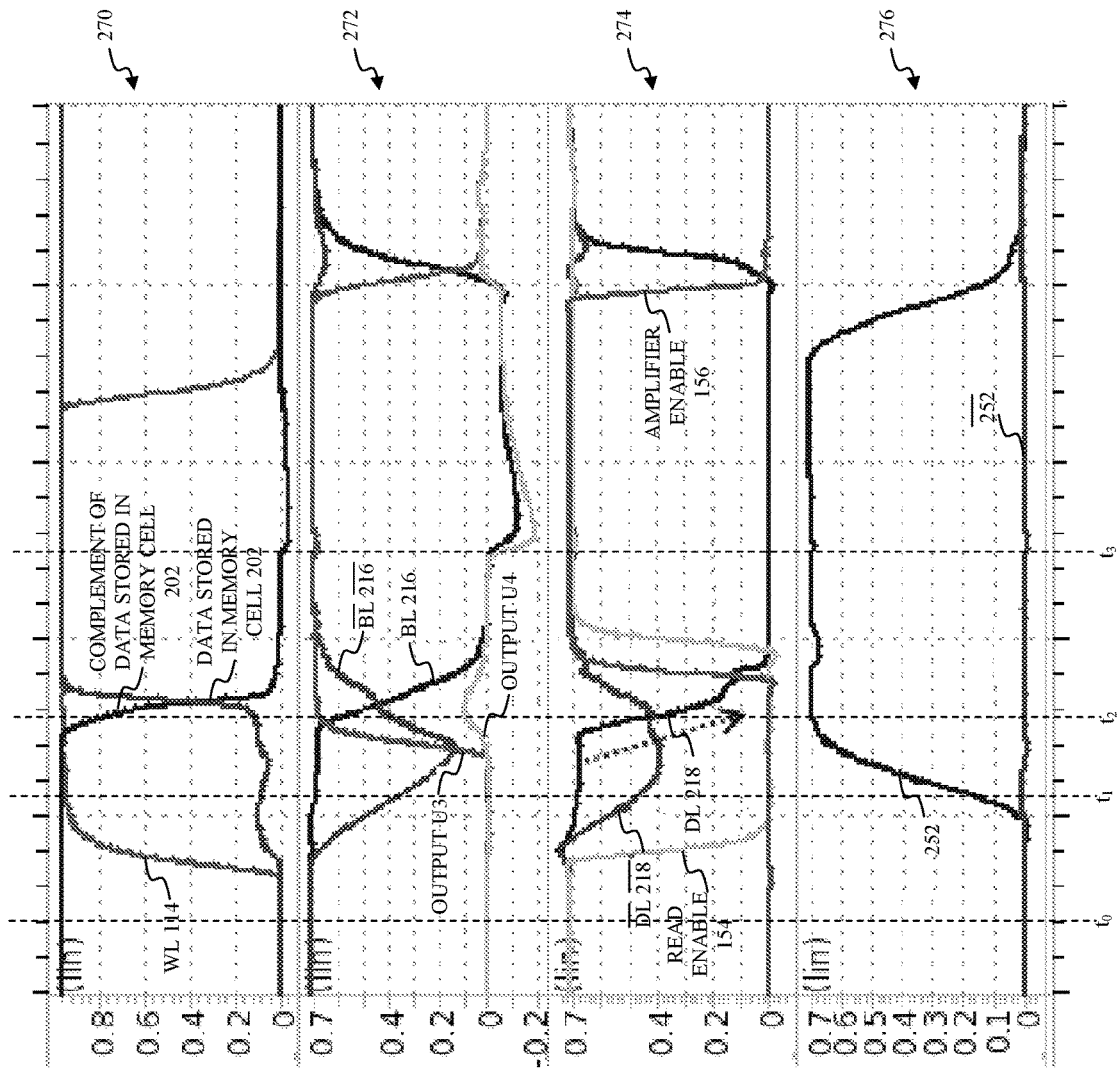
FIG. 2B illustrates exemplary waveforms illustrating operation of the first exemplary implementation according to an exemplary embodiment of the present disclosure.

FIG. 2A illustrates a block diagram of a first exemplary implementation for the exemplary memory storage device according to an exemplary embodiment of the present disclosure and FIG. 2B illustrates exemplary waveforms illustrating operation of the first exemplary implementation according to an exemplary embodiment of the present disclosure. A memory storage device 200 can be programmed to operate in the write mode of operation 170, the read mode of operation 172, and/or the bypass mode of operation 174 as described above in FIG. 1. In the exemplary embodiment illustrated in FIG. 2A, the memory storage device 200 can adjust, for example, pull-up or pull-down, the electronic data as the electronic data passes through the memory storage device 200 in the bypass mode of operation 174 as described above in FIG. 1. For example, the memory storage device 200 can pull-down the electronic data to the minimum potential and/or pull-up the electronic data to the maximum potential as the electronic data is passing through the memory storage device 200 in the bypass mode of operation 174 to compensate for this unwanted bias as described above in FIG. 1. As illustrated in FIG. 2A, the memory storage device 200 includes a memory cell 202, switch circuitry 204, a sense amplifier 206, a write driver 208, and boost bypass circuitry 210. Although, the memory storage device 200 is illustrated in FIG. 2A as including the memory cell 202, those skilled in the relevant art(s) will recognize the memory storage device 200 can be readily modified to include additionally memory cells in accordance with the teachings herein without departing from the spirit and scope of the present disclosure. Moreover, although not illustrated in FIG. 2A, the memory storage device 200 can include other electronic circuitry, such as a row-address decoder and/or a column-address decoder to provide some examples, which will be apparent to those skilled in the relevant art(s) without departing from the spirit and scope of the present disclosure. The memory storage device 200 can represent an exemplary embodiment of the memory storage device 100 as described above in FIG. 1. As such, the memory cell 202, the switch circuitry 204, the sense amplifier 206, the write driver 208, and the boost bypass circuitry 210 can represent exemplary embodiments of one of the memory cells 112.1.1 through 112.m.n, the switch circuitry 104, a sense amplifier 106, a write driver 108, and boost bypass circuitry 110 as described above in FIG. 1.

The switch circuitry 204 electrically couples a bitline (BL) 216 and a complementary $\overline{BL}$ $\overline{216}$ to a dataline (DL) 218 and a complementary $\overline{DL}$ $\overline{218}$, respectively, and/or electrically decouples the BL 216 and the complementary $\overline{BL}$ $\overline{216}$ from the DL 218 and the complementary $\overline{DL}$ $\overline{218}$, respectively, in response to the read enable control signal 154 in a substantially similar manner as the switch circuitry 104 as described above in FIG. 1. As illustrated in FIG. 2A, the switch circuitry 204 includes p-type metal-oxide-semiconductor field-effect (PMOS) transistors P1 and P2. The PMOS transistor P1 and the PMOS transistor P2 electrically couple the BL 216 and the complementary $\overline{BL}$ $\overline{216}$ to the DL 218 and the complementary $\overline{DL}$ $\overline{218}$, respectively, in response to the read enable control signal 154 being at the first logical value, such as the logical zero. Otherwise, the PMOS transistor P1 and the PMOS transistor P2 electrically decouple the BL 216 and the complementary $\overline{BL}$ $\overline{216}$ from the DL 218 and the complementary $\overline{DL}$ $\overline{218}$, respectively, in response to the read enable control signal 154 being at the second logical value, such as the logical one.

The sense amplifier 206 reads the DL 218 and the complementary $\overline{DL}$ $\overline{218}$ from the memory cell 202 to provide an output data bit 250 and a complementary output data bit $\overline{250}$ in response to the amplifier enable control signal 156 in a substantially similar manner as the sense amplifier 106 as described above in FIG. 1. In the exemplary embodiment illustrated in FIG. 2A, the sense amplifier 206 compares a difference, also referred to as a read margin (RM), between the DL 218 and the complementary $\overline{DL}$ $\overline{218}$ to determine whether the first logical value, such as the logical zero, or the second logical value, such as the logical one, are stored within the memory cell 202. The sense amplifier 106 provides the first logical value, such as the logical zero, to the output data bit 250 and the second logical value, such as the logical one, to the complementary output data bit $\overline{250}$ when the DL 218 is greater than the complementary $\overline{DL}$ $\overline{218}$. Otherwise, the sense amplifier 106 provides the second logical value, such as the logical one, to the output data bit 250 and the first logical value, such as the logical zero, to the complementary output data bit $\overline{250}$ when the DL 218 is less than the complementary $\overline{DL}$ $\overline{218}$.

The write driver 208 provides a complement of an input data bit 252 and a complement of a complementary input data bit $\overline{252}$ to the BL 216 and the complementary $\overline{BL}$ $\overline{216}$, respectively, in response to the write enable control signal 158 in a substantially similar manner as the write driver 108 as described above in FIG. 1. In the exemplary embodiment illustrated in FIG. 2A, the write driver 208 includes PMOS transistors P3 and P4, n-type metal-oxide-semiconductor field-effect (NMOS) transistors N1 and N2, logical NAND gates U1 and U2 and logical INVERTER gates U3 and U4. As illustrated in FIG. 2A, the logical NAND gates U1 and U2 provide the second logical value, such as the logical one, in response to the write enable control signal 158 being at the first logical value, such as the logical zero, to deactivate the write driver 208. The second logical value, such as the logical one, when provided by the logical NAND gates U1 and U2, deactivate, namely, turn-off, the PMOS transistors P3 and P4 and the NMOS transistors N1 and N2. Otherwise, the logical NAND gates U1 and U2 provide the complement of the input data bit 252 and the complement of the complementary input data bit $\overline{252}$, respectively, in response to the write enable control signal 158 being at the second logical value, such as the logical one, to activate the write driver 208. In the exemplary embodiment illustrated in FIG. 2A, the logical INVERTER gates U3 and U4 perform a logical inversion operation on the output provided by the logical NAND gates U1 and U2 to activate and/or deactivate the NMOS transistors N1 and N2. The PMOS transistors P3 and P4, when activated, namely, turned-on, provide an operational voltage supply $V_{DD}$ to the BL 216 and the complementary $\overline{BL}$ $\overline{216}$, respectively. Similarly, the NMOS transistors N1 and N2, when activated, namely, turned-on, provide a ground potential to the BL 216 and the complementary $\overline{BL}$ $\overline{216}$, respectively.

As illustrated in FIG. 2A, when the input data bit 252 is at the first logical value, such as the logical zero, the complementary input data bit $\overline{252}$ is at the second logical value, such as the logical one. Assuming the write enable control signal 158 is at the second logical value, such as the logical one, to enable the write driver 208, the logical NAND gates U1 and U2 provide the second logical value, such as the logical one, and the first logical value, such as the logical zero, respectively. The first logical value, such as the logical zero, provided by the logical NAND gate U2 activates the PMOS transistor P4 to pull-up the BL 216 to the first logical value, namely, the operational voltage supply $V_{DD}$ and the second logical value, such as the logical one, provided by the logical NAND gate U1 deactivates the PMOS transistor P3. Thereafter, the logical INVERTER gate U4 provides the second logical value, such as the logical one, to activate the NMOS transistor N2 to pull-down the complementary $\overline{BL}$ $\overline{216}$ to the second logical value, namely the ground potential and the logical INVERTER gate U3 provides the first logical value, such as the logical zero, to deactivate the NMOS transistor N1.

Similarly, when the input data bit 252 is at the second logical value, such as the logical one, the complementary input data bit $\overline{252}$ is at the first logical value, such as the logical zero. Assuming the write enable control signal 158 is at the second logical value, such as the logical one, to enable the write driver 208, the logical NAND gates U1 and U2 provide the first logical value, such as the logical zero, and the second logical value, such as the logical one, respectively. The second logical value, such as the logical one, provided by the logical NAND gate U2 deactivates the PMOS transistor P4 and the first logical value, such as the logical zero, provided by the logical NAND gate U1 activates the PMOS transistor P3 to pull-up the complementary $\overline{BL}$ $\overline{216}$ to the first logical value, namely, the operational voltage supply $V_{DD}$. Thereafter, the logical INVERTER gate U4 provides the first logical value, such as the logical zero, to deactivate the NMOS transistor N2 and the logical INVERTER gate U3 provides the second logical value, such as the logical one, to activate the NMOS transistor N1 to pull-down the BL 216 to the second logical value, namely the ground potential.

The boost bypass circuitry 210 can adjust, for example, pull-up and/or pull-down, the input data bit 252 and the complementary input data bit $\overline{252}$ in response to the boost enable control signal 160. As illustrated in FIG. 2A, the boost bypass circuitry 210 includes logical NOR gates U5 and U6, logical INVERTER gates U7 and U8, and NMOS transistors N3 and N4. The logical NOR gate U5 performs a logical NOR operation on the input data bit 252 and the complementary input data bit $\overline{252}$ to detect the presence of the input data bit 252 and the complementary input data bit $\overline{252}$. Thereafter, the logical NOR gate U5 provides the first logical value, such as the logical zero, when the input data bit 252 and/or the complementary input data bit $\overline{252}$ are at the second logical value, such as the logical one. The logical NOR gate U6 performs a logical NOR operation on the output of the logical NOR gate U5 and the boost enable control signal 160. The logical NOR gate U6 provides the first logical value, such as the logical zero, to deactivate, namely, turn-off, the NMOS transistors N3 and N4 or the second logical value, such as the logical one, to activate, namely, turn-on, the NMOS transistors N3 and N4. The logical INVERTER gates U7 and U8 perform logical inversion operations on the input data bit 252 and/or the complementary input data bit $\overline{252}$, respectively. The NMOS transistors N3 and N4, when activated, effectively pull-up and/or pull-down the DL 218 to the input data bit 252 and the complementary $\overline{DL}$ $\overline{218}$ to the complementary input data bit $\overline{252}$, respectively. As discussed above, the switch circuitry 204 introduces the unwanted bias into the electronic data causing the DL 218 and/or the complementary $\overline{DL}$ $\overline{218}$ to be at a first intermediate voltage level greater than the ground potential when at the first logical value, such as the logical zero, or at a second intermediate voltage level less than the operational voltage supply $V_{DD}$ when at the second logical value, such as the logical one. The NMOS transistors N3 and N4, when activated, effectively pull-up and/or pull-down the voltage on the DL 218 to the input data bit 252 and the complementary $\overline{DL}$ $\overline{218}$ to the complementary input data bit $\overline{252}$, respectively.

As illustrated in FIG. 2A, when the input data bit 252 is at the first logical value, such as the logical zero, the complementary input data bit $\overline{252}$ is at the second logical value, such as the logical one. In this situation, as described above, the DL 218 is at the first logical value, such as the logical zero, and the complementary $\overline{DL}$ $\overline{218}$ is at the second logical value, such as the logical one. However, the unwanted bias introduced by the switch circuitry 204 can cause the DL 218 be at a first intermediate voltage that is greater than the minimum potential, namely, the ground potential and the complementary $\overline{DL}$ $\overline{218}$ be at a second intermediate voltage that is less than the maximum potential, namely, the operational voltage supply $V_{DD}$. Assuming the boost enable control signal 160 is at the first logical value, such as the logical zero, to enable the boost bypass circuitry 210, the logical NOR gate U5 provides the first logical value, such as the logical zero, and the logical NOR gate U6 provides the second logical value, such as the logical one, to activate the NMOS transistors N3 and N4. The logical INVERTER gates U7 and U8 provide the second logical value, such as the logical one, and the first logical value, such as the logical zero. The NMOS transistor N3, when activated, pulls down the voltage on the DL 218 to be at an equivalent potential as the output of the logical INVERTER gate U7, namely, the ground potential. The NMOS transistor N4, when activated, pulls up the voltage on the complementary $\overline{DL}$ $\overline{218}$ to be at an equivalent potential as the output of the logical INVERTER gate U8, namely, the operational voltage supply $V_{DD}$. This pulling down of the DL 218 and pulling up of the complementary $\overline{DL}$ $\overline{218}$ effectively increases a difference, namely, a read margin (RM), between the first logical value, such as the logical zero, and the second logical value, such as the logical one.

Similarly, when the input data bit 252 is at the second logical value, such as the logical one, the complementary input data bit $\overline{252}$ is at the first logical value, such as the logical zero. In this situation, as described above, the DL 218 is at the second logical value, such as the logical one, and the complementary $\overline{DL}$ $\overline{218}$ is at the first logical value, such as the logical zero. However, the unwanted bias introduced by the switch circuitry 204 can cause the DL 218 be at a first intermediate voltage that is less than the maximum potential, namely, the operational voltage supply $V_{DD}$, and the complementary $\overline{DL}$ $\overline{218}$ be at a second intermediate voltage that is greater than the minimum potential, namely, the ground potential. Assuming the boost enable control signal 160 is at the first logical value, such as the logical zero, to enable the boost bypass circuitry 210, the logical NOR gate U5 provides the first logical value, such as the logical zero, and the logical NOR gate U6 provides the second logical value, such as the logical one, to activate the NMOS transistors N3 and N4. The logical INVERTER gates U7 and U8 provide the second logical value, such as the logical one, and the first logical value, such as the logical zero. The NMOS transistor N3, when activated, pulls up the voltage on the DL 218 to be at an equivalent potential as the output of the logical INVERTER gate U7, namely, the operational voltage supply $V_{DD}$. The NMOS transistor N4, when activated, pulls down the voltage on the complementary $\overline{DL\ 218}$ to be at an equivalent potential as the output of the logical INVERTER gate U8, namely, the ground potential. This pulling down of the DL 218 and pulling up of the complementary $\overline{DL\ 218}$ effectively increases a difference, namely, a read margin (RM), between the first logical value, such as the logical zero, and the second logical value, such as the logical one.

Exemplary waveforms illustrating the operation of the memory storage device 200 as described above in FIG. 2A are illustrated in FIG. 2B. Those skilled in the relevant art(s) will recognize the memory storage device 200 can operate differently than illustrated in FIG. 2B in accordance with description above in FIG. 2A without departing from the spirit and scope of the present disclosure.

At time $t_0$ as illustrated in FIG. 2B, the memory storage device 200 pre-charges the BL 216 and the complementary $\overline{BL\ 216}$ to be the logical one as illustrated in a timing diagram 272 in FIG. 2B. Similarly, the DL 218 and the complementary $\overline{DL\ 218}$ are pre-charged to be the logical one as illustrated in a timing diagram 274 in FIG. 2B.

At time $t_1$ as illustrated in FIG. 2B, the memory storage device 200 asserts one of the WLs 114.1 through 114.n corresponding to the memory cell 202 one as illustrated in a timing diagram 270 in FIG. 2B and de-asserts the read enable control signal 154 and the amplifier enable control signal 156 as illustrated in a timing diagram 274 in FIG. 2B. This assertion of the WL 114 as illustrated in a timing diagram 270 in FIG. 2B causes the data stored in the memory cell 202 and the complement of the data stored in the memory cell 202 as illustrated in the timing diagram 270 in FIG. 2B to be written on the BL 216 and the complementary $\overline{BL\ 216}$. As illustrated in the timing diagram 272 in FIG. 2B, the data stored in the memory cell 202 when at the logical zero, discharges the pre-charged BL 216 toward the logical zero. However, because the complement of the data stored in the memory cell 202 is at the logical one, the complement of the data stored in the memory cell 202 does not discharge the complementary $\overline{BL\ 216}$. Rather, the complementary $\overline{BL\ 216}$ remains pre-charged to the logical one. As illustrated in the timing diagram 274 in FIG. 2B, the de-assertion of the read enable control signal 154 activates the PMOS transistor P1 and the PMOS transistor P2 as illustrated in FIG. 2A which similarly discharges the complementary $\overline{DL\ 218}$ toward the logical zero leaving the DL 218 pre-charged to the logical one. And, the de-assertion of the amplifier enable control signal 156 enables the sense amplifier 206 as illustrated in FIG. 2A to provide the DL 218 and the complementary $\overline{DL\ 218}$ as the output data bit 250 and the complementary output data bit $\overline{250}$ in the read mode of operation.

At time $t_2$ as illustrated in FIG. 2B, the memory storage device 200 sets the input data bit 252 to be the logical one and the complementary input data bit $\overline{252}$ is the logical zero as illustrated in the timing diagram 276 in FIG. 2B. This causes an output of the logical INVERTER gate U3 to transition from the logical zero to the logical one while an output of the logical INVERTER gate U4 remains at the logical zero as illustrated in a timing diagram 272 in FIG. 2B. This activates the NMOS transistor N1 and the PMOS transistor P4 and deactivates the NMOS transistor N2 and the PMOS transistor P3 as illustrated in FIG. 2A to cause the BL 216 to transition toward the logical one and the complementary $\overline{BL\ 216}$ to transition toward the logical zero as illustrated in the timing diagram 272 in FIG. 2B.

At time $t_3$ as illustrated in FIG. 2B, the memory storage device 200 de-asserts the read enable control signal 154 and the amplifier enable control signal 156 to isolate the sense amplifier 206 from the memory cell 202 to write the BL 216 and the complementary $\overline{BL\ 216}$ into the memory cell 202 in the write mode of operation.

Figure 3:
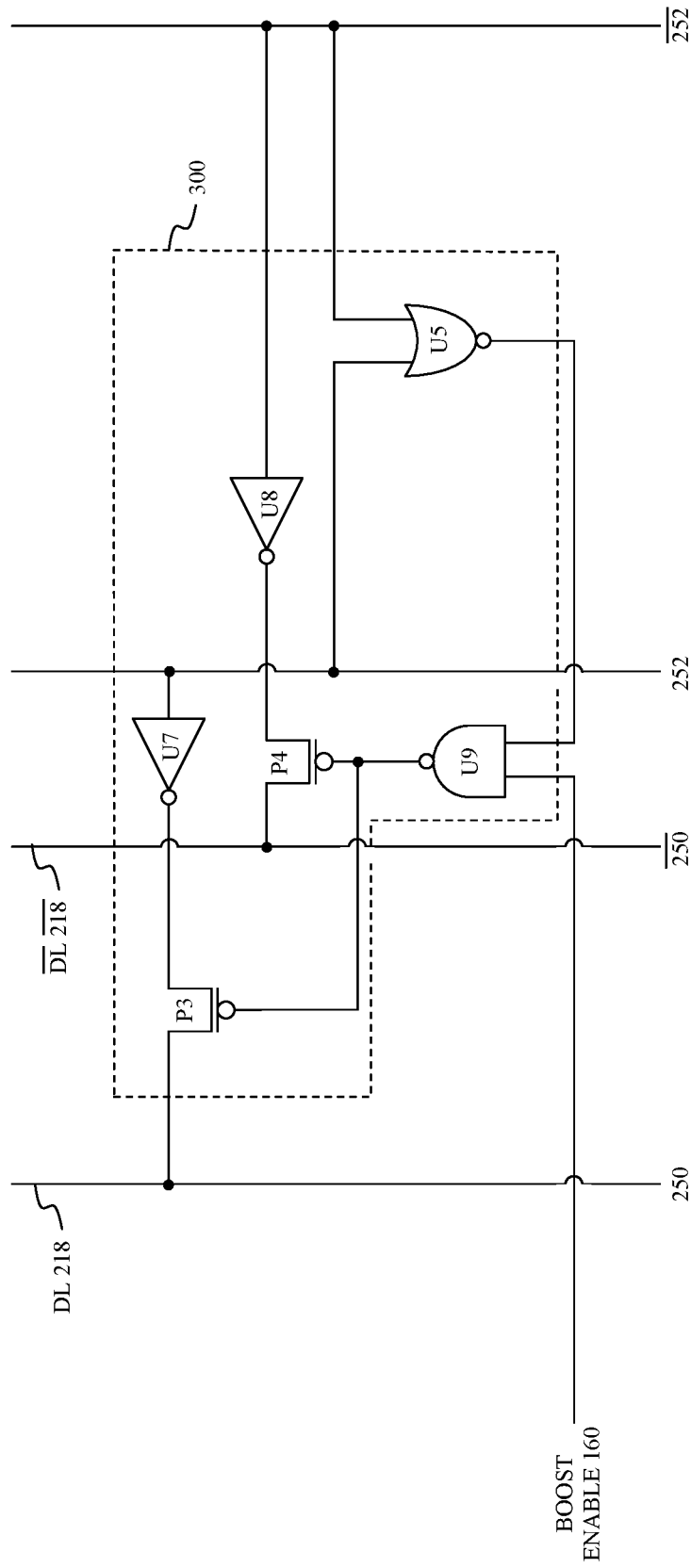
FIG. 3 illustrates a block diagram of a first alternate boost bypass circuitry that can implement within the exemplary memory storage device according to an exemplary embodiment of the present disclosure.

Alternate Boost Bypass Circuitry that can Implement within the Exemplary Memory Storage Device FIG. 3 illustrates a block diagram of a first alternate boost bypass circuitry that can implement within the exemplary memory storage device according to an exemplary embodiment of the present disclosure. In the exemplary embodiment illustrated in FIG. 3, boost bypass circuitry 300 can adjust, for example, pull-up and/or pull-down, the input data bit 252 and the complementary input data bit $\overline{252}$ in response to the boost enable control signal 160 in a substantially similar manner as the boost bypass circuitry 110 as described above in FIG. 1. As illustrated in FIG. 3, the boost bypass circuitry 300 includes the logical NOR gate U5, the logical INVERTER gates U7 and U8, a logical NAND gate U9, and PMOS transistors P3 and P4. The boost bypass circuitry 300 can represent an exemplary embodiment of the boost bypass circuitry 110 as described above in FIG. 1 and/or a first alternate to the boost bypass circuitry 210 as described above in FIG. 2A.

The logical NOR gate U5 performs a logical NOR operation on the input data bit 252 and the complementary input data bit $\overline{252}$ in a substantially similar manner as discussed above in FIG. 2A. The logical NAND gate U9 performs a logical NAND operation on the output of the logical NOR gate U5 and the boost enable control signal 160. The logical NAND gate U9 provides the first logical value, such as the logical zero, to activate, namely, turn-on, the PMOS transistors P3 and P4 or the second logical value, such as the logical one, to deactivate, namely, turn-off, the PMOS transistors P3 and P4. The logical INVERTER gates U7 and U8 perform logical inversion operations on the input data bit 252 and/or the complementary input data bit $\overline{252}$, respectively in a substantially similar manner as discussed above in FIG. 2A. The PMOS transistors P3 and P4, when activated, effectively pull-up and/or pull-down the voltage on the DL 218 to the input data bit 252 and the voltage on the complementary $\overline{DL\ 218}$ to the complementary input data bit $\overline{252}$, respectively. As discussed above, the switch circuitry 204 introduces the unwanted bias into the electronic data causing the DL 218 and/or the complementary $\overline{DL\ 218}$ to be at a first intermediate voltage level greater than the ground potential when at the first logical value, such as the logical zero, or at a second intermediate voltage level less than the operational voltage supply $V_{DD}$ when at the second logical value, such as the logical one. The PMOS transistors P3 and P4, when activated, effectively pull-up and/or pull-down the DL 218 to the input data bit 252 and the complementary $\overline{DL\ 218}$ to the complementary input data bit $\overline{252}$, respectively.

As illustrated in FIG. 3, when the input data bit 252 is at the first logical value, such as the logical zero, the complementary input data bit $\overline{252}$ is at the second logical value, such as the logical one. In this situation, as described above, the DL 218 is at the first logical value, such as the logical zero, and the complementary $\overline{DL\ 218}$ is at the second logical value, such as the logical one. However, the unwanted bias introduced by the switch circuitry 204 can cause the DL 218 be at a first intermediate voltage that is greater than the minimum potential, namely, the ground potential and the complementary $\overline{\text{DL 218}}$ be at a second intermediate voltage that is less than the maximum potential, namely, the operational voltage supply $V_{DD}$. Assuming the boost enable control signal 160 is at the first logical value, such as the logical zero, to enable the boost bypass circuitry 210, the logical NOR gate U5 provides the first logical value, such as the logical zero, and the logical NAND gate U9 provides the first logical value, such as the logical zero, to activate the PMOS transistors P3 and P4. The logical INVERTER gates U7 and U8 provide the second logical value, such as the logical one, and the first logical value, such as the logical zero. The PMOS transistor P3, when activated, pulls down the DL 218 to be at an equivalent potential as the output of the logical INVERTER gate U7, namely, the ground potential. The PMOS transistor P4, when activated, pulls up the complementary $\overline{\text{DL 218}}$ to be at an equivalent potential as the output of the logical INVERTER gate U8, namely, the operational voltage supply $V_{DD}$. This pulling down of the DL 218 and pulling up of the complementary $\overline{\text{DL 218}}$ effectively increases a difference, namely, a read margin (RM), between the first logical value, such as the logical zero, and the second logical value, such as the logical one.

Similarly, when the input data bit 252 is at the second logical value, such as the logical one, the complementary input data bit $\overline{\text{252}}$ is at the first logical value, such as the logical zero. In this situation, as described above, the DL 218 is at the second logical value, such as the logical one, and the complementary $\overline{\text{DL 218}}$ is at the first logical value, such as the logical zero. However, the unwanted bias introduced by the switch circuitry 204 can cause the DL 218 be at a first intermediate voltage that is less than the maximum potential, namely, the operational voltage supply $V_{DD}$, and the complementary $\overline{\text{DL 218}}$ be at a second intermediate voltage that is greater than the minimum potential, namely, the ground potential. Assuming the boost enable control signal 160 is at the first logical value, such as the logical zero, to enable the boost bypass circuitry 210, the logical NOR gate U5 provides the first logical value, such as the logical zero, and the logical NAND gate U9 provides the first logical value, such as the logical zero, to activate the PMOS transistors P3 and P4. The logical INVERTER gates U7 and U8 provide the second logical value, such as the logical one, and the first logical value, such as the logical zero. The PMOS transistor P3, when activated, pulls up the voltage on the DL 218 to be at an equivalent potential as the output of the logical INVERTER gate U7, namely, the operational voltage supply $V_{DD}$. The PMOS transistor P4, when activated, pulls down the voltage on the complementary $\overline{\text{DL 218}}$ to be at an equivalent potential as the output of the logical INVERTER gate U8, namely, the ground potential. This pulling down of the DL 218 and pulling up of the complementary $\overline{\text{DL 218}}$ effectively increases a difference, namely, a read margin (RM), between the first logical value, such as the logical zero, and the second logical value, such as the logical one.

Figure 4:
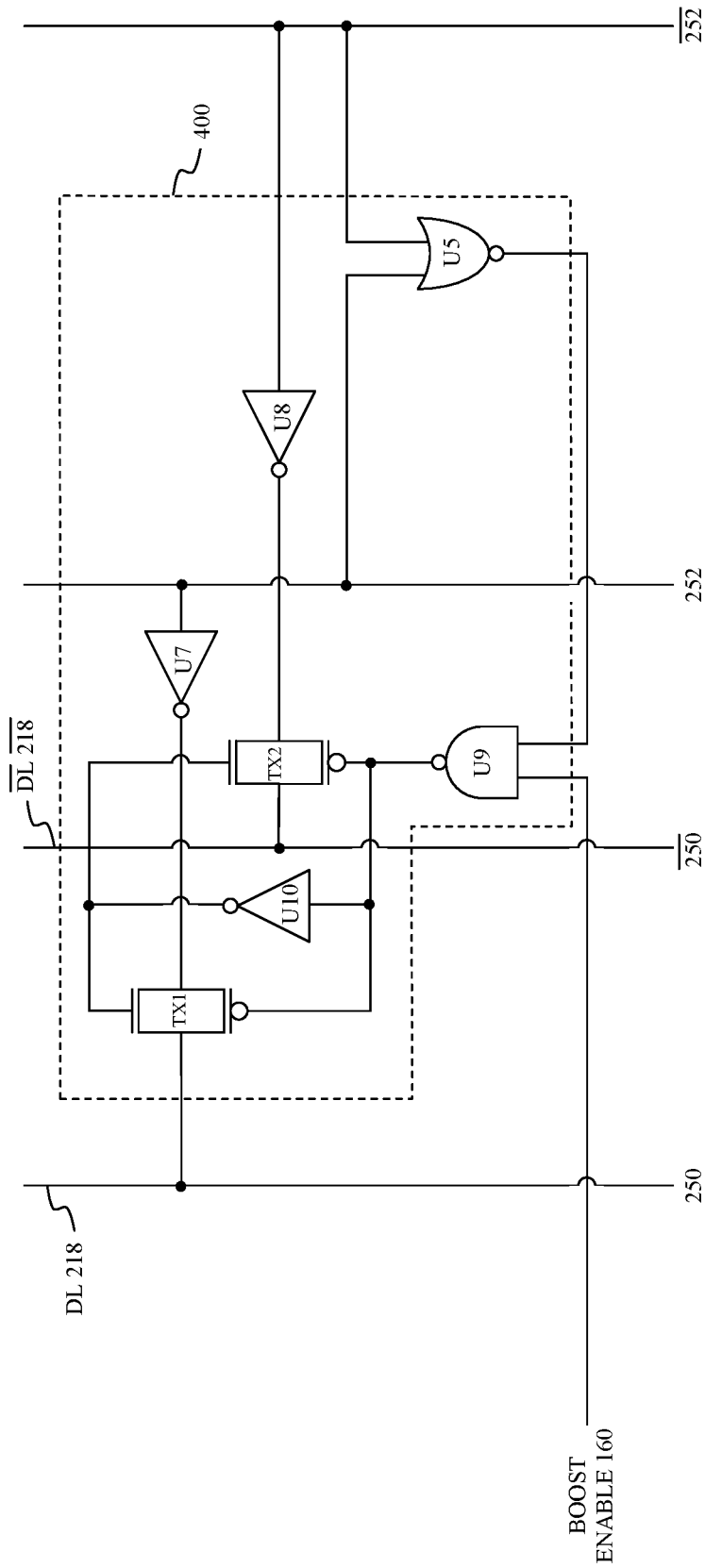
FIG. 4 illustrates a block diagram of a second alternate boost bypass circuitry that can implement within the exemplary memory storage device according to an exemplary embodiment of the present disclosure.

FIG. 4 illustrates a block diagram of a second alternate boost bypass circuitry that can implement within the exemplary memory storage device according to an exemplary embodiment of the present disclosure. In the exemplary embodiment illustrated in FIG. 4, boost bypass circuitry 400 can adjust, for example, pull-up and/or pull-down, the input data bit 252 and the complementary input data bit $\overline{\text{252}}$ in response to the boost enable control signal 160 in a substantially similar manner as the boost bypass circuitry 110 as described above in FIG. 1. As illustrated in FIG. 4, the boost bypass circuitry 400 includes the logical NOR gate U5, the logical INVERTER gates U7 and U8, the logical NAND gate U9, a logical INVERTER gate U10, and transmission gates TX1 and TX2. The boost bypass circuitry 400 can represent an exemplary embodiment of the boost bypass circuitry 110 as described above in FIG. 1 and/or a second alternate to the boost bypass circuitry 210 as described above in FIG. 2A.

The logical NOR gate U5 performs a logical NOR operation on the input data bit 252 and the complementary input data bit $\overline{\text{252}}$ in a substantially similar manner as discussed above in FIG. 2A. The logical NAND gate U9 performs a logical NAND operation on the output of the logical NOR gate U5 and the boost enable control signal 160 in a substantially similar manner as discussed above in FIG. 3. The logical INVERTER gates U7 and U8 perform logical inversion operations on the input data bit 252 and/or the complementary input data bit $\overline{\text{252}}$, respectively in a substantially similar manner as discussed above in FIG. 2A. The logical INVERTER gate U10 performs a logical inversion operation on the output of the logical NAND gate U9 to provide complementary control signals for the transmission gates TX1 and TX2. The transmission gates TX1 and TX2, when activated, effectively pull-up and/or pull-down the voltage on the DL 218 to the input data bit 252 and the voltage on the complementary $\overline{\text{DL 218}}$ to the complementary input data bit $\overline{\text{252}}$, respectively. As discussed above, the switch circuitry 204 introduces the unwanted bias into the electronic data causing the DL 218 and/or the complementary $\overline{\text{DL 218}}$ to be at a first intermediate voltage level greater than the ground potential when at the first logical value, such as the logical zero, or at a second intermediate voltage level less than the operational voltage supply $V_{DD}$ when at the second logical value, such as the logical one. The transmission gates TX1 and TX2, when activated, effectively pull-up and/or pull-down the DL 218 to the input data bit 252 and the complementary $\overline{\text{DL 218}}$ to the complementary input data bit $\overline{\text{252}}$, respectively.

As illustrated in FIG. 4, when the input data bit 252 is at the first logical value, such as the logical zero, the complementary input data bit $\overline{\text{252}}$ is at the second logical value, such as the logical one. In this situation, as described above, the DL 218 is at the first logical value, such as the logical zero, and the complementary $\overline{\text{DL 218}}$ is at the second logical value, such as the logical one. However, the unwanted bias introduced by the switch circuitry 204 can cause the DL 218 be at a first intermediate voltage that is greater than the minimum potential, namely, the ground potential and the complementary $\overline{\text{DL 218}}$ be at a second intermediate voltage that is less than the maximum potential, namely, the operational voltage supply $V_{DD}$. Assuming the boost enable control signal 160 is at the first logical value, such as the logical zero, to enable the boost bypass circuitry 210, the logical NOR gate U5 provides the first logical value, such as the logical zero, the logical NAND gate U9 provides the first logical value, such as the logical zero, and the logical INVERTER gate U10 provides the second logical value, such as the logical one, to activate the transmission gates TX1 and TX2. The logical INVERTER gates U7 and U8 provide the second logical value, such as the logical one, and the first logical value, such as the logical zero. The transmission gate TX1, when activated, pulls down the voltage on the DL 218 to be at an equivalent potential as the output of the logical INVERTER gate U7, namely, the ground potential. The transmission gate TX2, when activated, pulls up the voltage on the complementary $\overline{\text{DL 218}}$ to be at an equivalent potential as the output of the logical INVERTER gate U8, namely, the operational voltage supply $V_{DD}$. This pulling down of the DL 218 and pulling up of the complementary $\overline{DL\ 218}$ effectively increases a difference, namely, a read margin (RM), between the first logical value, such as the logical zero, and the second logical value, such as the logical one.

Similarly, when the input data bit 252 is at the second logical value, such as the logical one, the complementary input data bit $\overline{252}$ is at the first logical value, such as the logical zero. In this situation, as described above, the DL 218 is at the second logical value, such as the logical one, and the complementary $\overline{DL\ 218}$ is at the first logical value, such as the logical zero. However, the unwanted bias introduced by the switch circuitry 204 can cause the DL 218 be at a first intermediate voltage that is less than the maximum potential, namely, the operational voltage supply $V_{DD}$, and the complementary $\overline{DL\ 218}$ be at a second intermediate voltage that is greater than the minimum potential, namely, the ground potential. Assuming the boost enable control signal 160 is at the first logical value, such as the logical zero, to enable the boost bypass circuitry 210, the logical NOR gate U5 provides the first logical value, such as the logical zero, the logical NAND gate U9 provides the first logical value, such as the logical zero, and the logical INVERTER gate U10 provides the second logical value, such as the logical one, to activate the transmission gates TX1 and TX2. The logical INVERTER gates U7 and U8 provide the second logical value, such as the logical one, and the first logical value, such as the logical zero. The transmission gate TX1, when activated, pulls up the voltage on the DL 218 to be at an equivalent potential as the output of the logical INVERTER gate U7, namely, the operational voltage supply $V_{DD}$. The transmission gate TX2, when activated, pulls down the voltage on the complementary $\overline{DL\ 218}$ to be at an equivalent potential as the output of the logical INVERTER gate U8, namely, the ground potential. This pulling down of the DL 218 and pulling up of the complementary $\overline{DL\ 218}$ effectively increases a difference, namely, a read margin (RM), between the first logical value, such as the logical zero, and the second logical value, such as the logical one.

Figure 5:
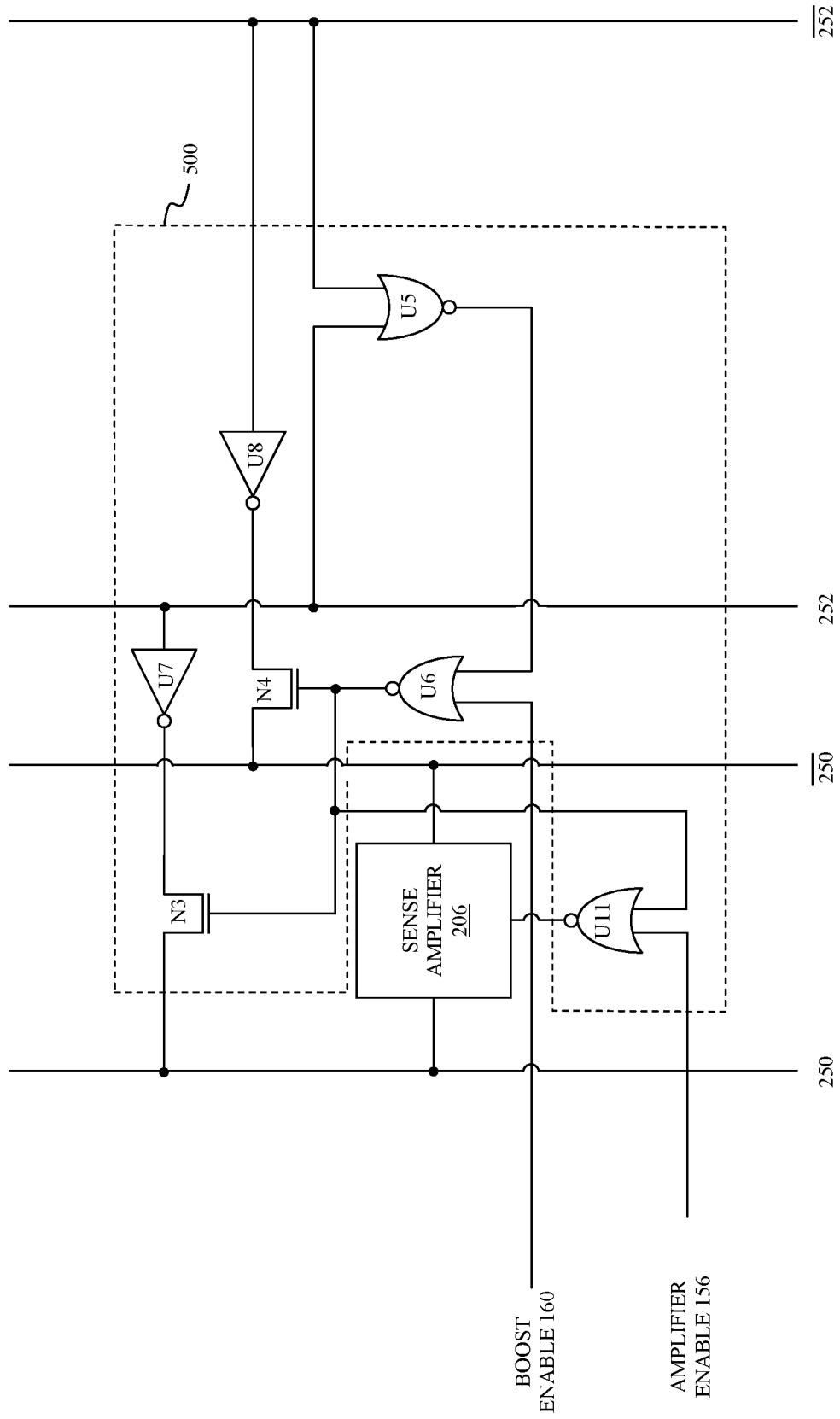
FIG. 5 illustrates a block diagram of a third alternate boost bypass circuitry that can implement within the exemplary memory storage device according to an exemplary embodiment of the present disclosure.

FIG. 5 illustrates a block diagram of a third alternate boost bypass circuitry that can implement within the exemplary memory storage device according to an exemplary embodiment of the present disclosure. In the exemplary embodiment illustrated in FIG. 5, boost bypass circuitry 500 can adjust, for example, pull-up and/or pull-down, the input data bit 252 and the complementary input data bit $\overline{252}$ in response to the boost enable control signal 160 in a substantially similar manner as the boost bypass circuitry 110 as described above in FIG. 1. The boost bypass circuitry 500 can represent an exemplary embodiment of the boost bypass circuitry 110 as described above in FIG. 1 and/or a third alternate to the boost bypass circuitry 210 as described above in FIG. 2A.

The boost bypass circuitry 500 operates in a substantially similar manner as the boost bypass circuitry 300 as described above in FIG. 3; therefore, only differences between the boost bypass circuitry 300 and the boost bypass circuitry 500 are to be discussed in further detail below. In the exemplary embodiment illustrated in FIG. 5, the boost bypass circuitry 500 further includes a logical NOR gate U11. As illustrated in FIG. 5, the logical NOR gate U11 performs a logical NOR operation on the amplifier enable control signal 156 and an output of the logical NOR gate U6 to synchronize activation and/or deactivation of the sense amplifier 206 with activation and/or deactivation of the boost bypass circuitry 500. Assuming the boost enable control signal 160 is at the first logical value, such as the logical zero, to enable the boost bypass circuitry 210, the logical NOR gate U6 provides the second logical value, such as the logical one, when the input data bit 252 and the complementary input data bit $\overline{252}$ are at a combination of the first logical value, such as the logical zero, and the second logical value, such as the logical one. Assuming the amplifier enable control signal 156 is at the first logical value, such as the logical zero, to enable the sense amplifier 206, the logical NOR gate U11 provides the first logical value, such as the logical zero, to activate the sense amplifier 206 in response to the logical NOR gate U6 provides the second logical value, such as the logical one.

Figure 6:
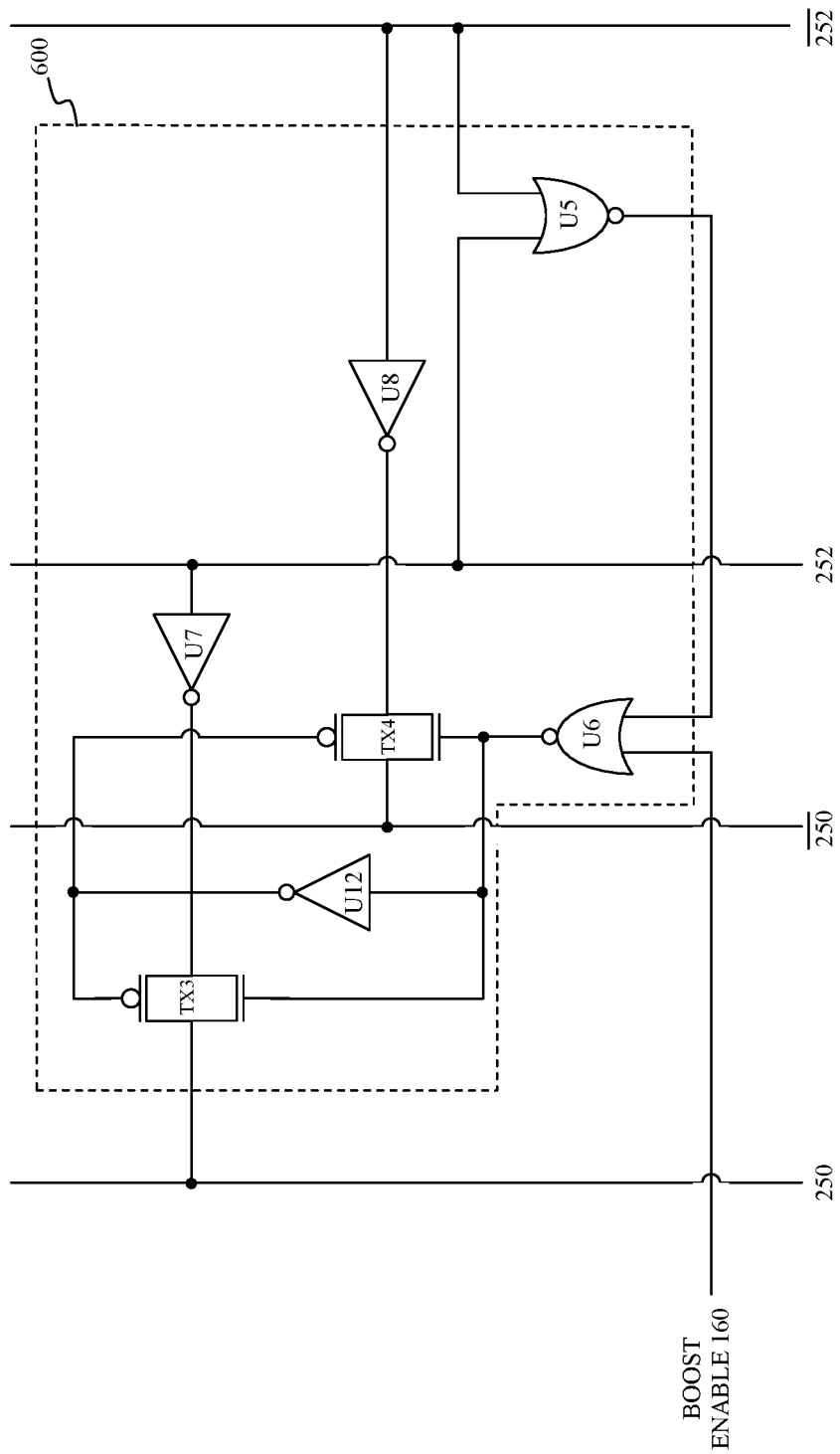
FIG. 6 illustrates a block diagram of a fourth alternate boost bypass circuitry that can implement within the exemplary memory storage device according to an exemplary embodiment of the present disclosure.

FIG. 6 illustrates a block diagram of a fourth alternate boost bypass circuitry that can implement within the exemplary memory storage device according to an exemplary embodiment of the present disclosure. In the exemplary embodiment illustrated in FIG. 6, boost bypass circuitry 600 can adjust, for example, pull-up and/or pull-down, the input data bit 252 and the complementary input data bit $\overline{252}$ in response to the boost enable control signal 160 in a substantially similar manner as the boost bypass circuitry 110 as described above in FIG. 1. The boost bypass circuitry 600 can represent an exemplary embodiment of the boost bypass circuitry 110 as described above in FIG. 1 and/or a fourth alternate to the boost bypass circuitry 210 as described above in FIG. 2A.

The boost bypass circuitry 600 operates in a substantially similar manner as the boost bypass circuitry 210 as described above in FIG. 2A; therefore, only differences between the boost bypass circuitry 210 and the boost bypass circuitry 600 are to be discussed in further detail below. In the exemplary embodiment illustrated in FIG. 6, the boost bypass circuitry 600 further includes a logical INVERTER gate U11, and transmission gates TX3 and TX4.

As illustrated in FIG. 6, the logical INVERTER gate U11 performs a logical inversion operation on the output of the logical NOR gate U6 to provide complementary control signals for the transmission gates TX3 and TX4. The transmission gates TX3 and TX4, when activated, effectively pull-up and/or pull-down the voltage on the DL 218 to the input data bit 252 and the voltage on the complementary $\overline{DL\ 218}$ to the complementary input data bit $\overline{252}$, respectively. As discussed above, the switch circuitry 204 introduces the unwanted bias into the electronic data causing the DL 218 and/or the complementary $\overline{DL\ 218}$ to be at a first intermediate voltage level greater than the ground potential when at the first logical value, such as the logical zero, or at a second intermediate voltage level less than the operational voltage supply $V_{DD}$ when at the second logical value, such as the logical one. The transmission gates TX3 and TX4, when activated, effectively pull-up and/or pull-down the DL 218 to the input data bit 252 and the complementary $\overline{DL\ 218}$ to the complementary input data bit $\overline{252}$, respectively.

Figure 7:
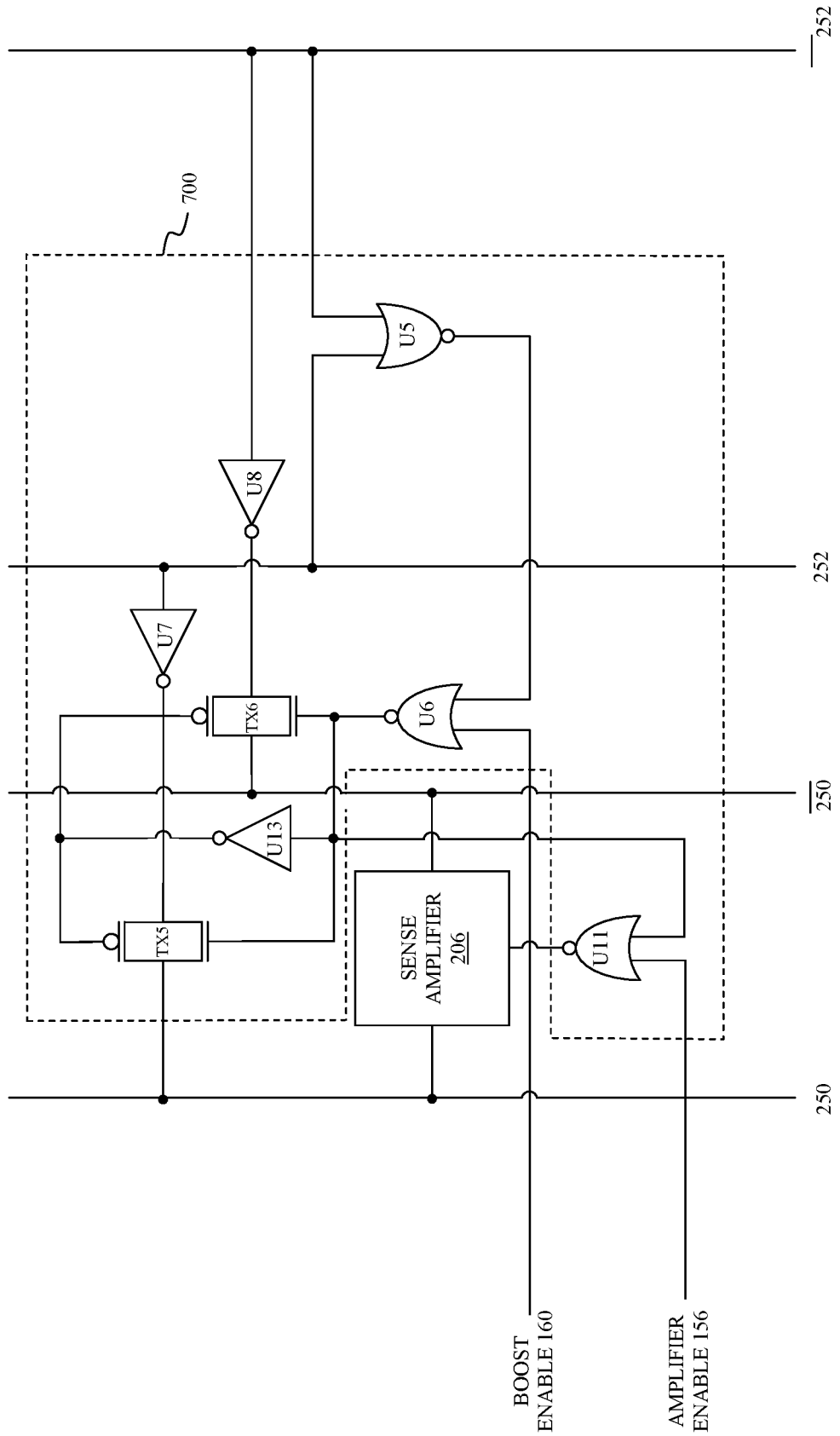
FIG. 7 illustrates a block diagram of a fifth alternate boost bypass circuitry that can implement within the exemplary memory storage device according to an exemplary embodiment of the present disclosure.

FIG. 7 illustrates a block diagram of a fifth alternate boost bypass circuitry that can implement within the exemplary memory storage device according to an exemplary embodiment of the present disclosure. In the exemplary embodiment illustrated in FIG. 7, boost bypass circuitry 700 can adjust, for example, pull-up and/or pull-down, the input data bit 252 and the complementary input data bit $\overline{252}$ in response to the boost enable control signal 160 in a substantially similar manner as the boost bypass circuitry 110 as described above in FIG. 1. The boost bypass circuitry 700 can represent an exemplary embodiment of the boost bypass circuitry 110 as described above in FIG. 1 and/or a fifth alternate to the boost bypass circuitry 210 as described above in FIG. 2A.

The boost bypass circuitry 700 operates in a substantially similar manner as the boost bypass circuitry 500 as described above in FIG. 5; therefore, only differences between the boost bypass circuitry 500 and the boost bypass circuitry 700 are to be discussed in further detail below. In the exemplary embodiment illustrated in FIG. 7, the boost bypass circuitry 700 further includes a logical INVERTER gate U13, and transmission gates TX5 and TX6.

As illustrated in FIG. 7, the logical INVERTER gate U13 performs a logical inversion operation on the output of the logical NOR gate U6 to provide complementary control signals for the transmission gates TX5 and TX6. The transmission gates TX5 and TX6, when activated, effectively pull-up and/or pull-down the voltage on the DL 218 to the input data bit 252 and the voltage on the complementary $\overline{DL}$ $\overline{218}$ to the complementary input data bit $\overline{252}$, respectively. As discussed above, the switch circuitry 204 introduces the unwanted bias into the electronic data causing the DL 218 and/or the complementary $\overline{DL}$ $\overline{218}$ to be at a first intermediate voltage level greater than the ground potential when at the first logical value, such as the logical zero, or at a second intermediate voltage level less than the operational voltage supply $V_{DD}$ when at the second logical value, such as the logical one. The transmission gates TX5 and TX6, when activated, effectively pull-up and/or pull-down the DL 218 to the input data bit 252 and the complementary $\overline{DL}$ $\overline{218}$ to the complementary input data bit $\overline{252}$, respectively.

Exemplary Operational Control Flow for the Exemplary Memory Storage Device

Figure 8:
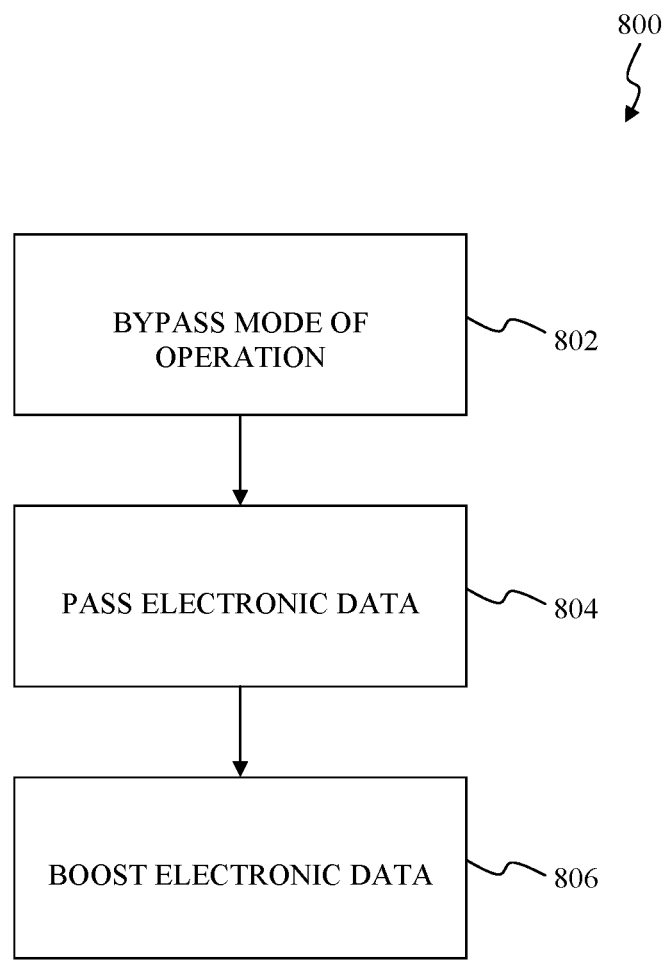
FIG. 8 illustrates a flowchart of exemplary operations for the exemplary memory storage device according to an exemplary embodiment of the present disclosure.

FIG. 8 illustrates a flowchart of exemplary operations for the exemplary memory storage device according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 800 for an exemplary memory storage device, such as the memory storage device 100 as described above in FIG. 1, operating in a bypass mode of operation, such as the bypass mode of operation 174 as described above in FIG. 1.

At operation 802, the operational control flow 800 configures the exemplary memory storage device to operate in the bypass mode of operation. In the exemplary embodiment illustrated in FIG. 8, the exemplary memory storage device includes one or more memory cells, such as the memory array 102 as described above in FIG. 1 and/or the memory cell 202 as described above in FIG. 2A. The operational control flow 800 configures one or more signal pathways within the exemplary memory storage device to bypass the one or more memory cells. This configuration can include activating various circuitry, such as the switch circuitry 104, the sense amplifier 106, the write driver 108, and the boost bypass circuitry 110 as described above in FIG. 1.

At operation 804, the operational control flow 800 passes electronic data through the exemplary memory storage device.

At operation 806, the operational control flow 800 adjusts the electronic data as it is passing through the exemplary memory storage device. The operational control flow 800 can pull-down the electronic data to the minimum potential and/or pull-up the electronic data to the maximum potential as the electronic data is passing through the exemplary memory storage during operation 804 to compensate for this unwanted bias. The operational control flow 800 can utilize boost bypass circuitry, such as the boost bypass circuitry 110 to provide an example, of the exemplary memory storage device to adjust the electronic data as it is passing through the exemplary memory storage device.

CONCLUSION

The foregoing Detailed Description discloses a memory storage device. The memory storage device includes a memory cell, a write driver, switch circuitry, boost circuitry, and a sense amplifier. The memory cell coupled to a bitline. The write driver provides an input data bit to the bitline. The switch circuitry electrically couples the bitline to a data line to pass the input data bit from the bitline to the data line. The boost circuitry adjusts a potential of the input data bit on the data line to match a potential of the input data bit on the bitline. The sense amplifier reads the input data bit from the data line to provide an output data bit.

The memory cell is coupled to a bitline and a complementary bitline. The write driver provides an input data bit to the complementary bitline and a complementary input data bit to the bitline. The switch circuitry electrically couples the bitline to a data line and the complementary bitline to a complementary data line to pass the complementary input data bit from the bitline to the data line and the input data bit from the complementary bitline to the complementary data line. The boost circuitry adjusts the complementary input data bit on the data line and the input data bit on the complementary data line. The sense amplifier configured to read the complementary input data bit from the data line and the input data bit from the complementary data line to provide an output data bit and a complementary output data bit, respectively.

The foregoing Detailed Description additionally discloses boost circuitry within a memory storage device. The boost circuitry includes a first logical INVERTER gate, a first switching element, a second logical INVERTER gate, a second switching element, and one or more logic gates. The first logical INVERTER gate performs a first logical inversion operation on an input data bit to provide a complimentary input data bit. The first switching element adjusts the complementary input data bit on a data line of the memory storage device to be a potential level of the complimentary input data bit. The second logical INVERTER gate performs a second logical inversion operation on the complimentary input data bit to provide the input data bit. The second switching element adjusts the input data bit on a complementary data line of the memory storage device to be a potential level of the input data bit. The one or more logic gates activate the first switching element and the second switching element in response to detecting a presence of the input data bit and the complementary input data bit and a boost enable control signal being at a first logical value, and deactivate the first switching element and the second switching element in response to not detecting the presence of the input data bit and the complementary input data bit or the boost enable control signal being at a second logical value different from the first logical value.

The foregoing Detailed Description further discloses a method for operating a memory storage device. The method includes receiving an input data bit on a bitline, electrically coupling the bitline to a data line to pass an input data bit from the bitline to the data line, adjusting a potential of the input data bit on the data line to be a potential of the input data bit on the bitline, and reading the input data bit from the data line to provide an output data bit.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A memory storage device, comprising:
   a memory cell, coupled to a bitline, configured to be deactivated in a bypass mode of operation;
   a write driver configured to provide an input data bit to the bitline in the bypass mode of operation;
   switch circuitry configured to couple the bitline to a data line to pass the input data bit on the bitline to the data line in the bypass mode of operation;
   boost circuitry configured to adjust a potential level of the input data bit on the data line to be a potential level of the input data bit on the bitline in the bypass mode of operation; and
   a sense amplifier configured to read the input data bit on the data line to provide an output data bit in the bypass mode of operation.

2. The memory storage device of claim 1, wherein the boost circuitry is configured to pull-down a voltage of the input data bit on the data line to be a voltage of the input data bit on the bitline.

3. The memory storage device of claim 1, wherein the boost circuitry is configured to pull-up a voltage of the input data bit on the data line to be a voltage of the input data bit on the bitline.

4. The memory storage device of claim 1, wherein the memory cell is further configured to be activated in a read mode of operation,
   wherein the switch circuitry is further configured to couple the bitline to the data line to pass a stored data bit from the memory cell to the data line in the read mode of operation,
   wherein the sense amplifier is further configured to read the stored data bit on the data line to provide the output data bit in the read mode of operation, and
   wherein the boost circuitry and the write driver are further configured to be deactivated in the read mode of operation.

5. The memory storage device of claim 1, wherein the memory cell is further configured to be activated in a write mode of operation,
   wherein the write driver is further configured to provide the input data bit to the bitline for storage into the memory cell in the write mode of operation,
   wherein the switch circuitry is further configured to decouple the bitline from the data line in the write mode of operation, and
   wherein the boost circuitry and the sense amplifier are further configured to be deactivated in the write mode of operation.

6. The memory storage device of claim 1, wherein the boost circuitry comprises:
   a logical INVERTER gate configured to perform a logical inversion operation on the input data bit on the bitline;
   a switching element configured to adjust the potential level of the input data bit on the data line to be a potential level of an output of the logical INVERTER gate; and
   one or more logic gates configured to activate or deactivate the switching element based upon a presence of the input data bit on the bitline.

7. The memory storage device of claim 1, wherein the switch circuitry comprises:

one or more transistors configured to couple the bitline to the data line to pass the input data bit on the bitline to the data line in the bypass mode of operation.

8. Boost circuitry within a memory storage device, comprising:

a first logical INVERTER gate configured to perform a first logical inversion operation on a first input data bit on a first bitline;

a first switching element configured to adjust a voltage of a first output data bit on a first data line to be a potential level of an output of the first logical INVERTER gate;

a second logical INVERTER gate configured to perform a second logical inversion operation on a second input data bit on a second bitline, the second input data bit being a complement of the first input data bit;

a second switching element configured to adjust a voltage of a second output data bit on a second data line to be a potential level of an output of the second logical INVERTER gate, the second output data bit being a complement of the first output data bit; and one or more logic gates configured to activate or deactivate the first switching element and the second switching element based upon a presence of the first input data bit on the first bitline and the second input bit on the second bitline.

9. The boost circuitry of claim 8, wherein the one or more logic gates are further configured to:

activate the first switching element and the second switching element in response to detecting the presence of the first input data bit on the first bitline and the second input data bit on the second bitline and in response to a boost enable control signal being at a first logical value; and deactivate the first switching element and the second switching element in response to not detecting the presence of the first input data bit on the first bitline and the second input data bit on the second bitline or in response to the boost enable control signal being at a second logical value different from the first logical value.

10. The boost circuitry of claim 8, wherein the first switching element and the second switching element comprise:

n-type metal-oxide-semiconductor (NMOS) field-effect transistors.

11. The boost circuitry of claim 10, wherein the one or more logic gates comprise:

a first logical NOR gate configured to perform a first logical NOR operation on the first input data bit on the first bitline and the second input data bit on the second bitline to detect the presence of the first input data bit on the first bitline and the second input data bit on the second bitline; and a second logical NOR gate configured to perform a second logical NOR operation on an output of the first logical NOR gate and a boost enable control signal to activate or to deactivate the first switching element and the second switching element in response thereto.

12. The boost circuitry of claim 8, wherein the first switching element and the second switching element comprise:

p-type metal-oxide-semiconductor (PMOS) field-effect transistors.

13. The boost circuitry of claim 12, wherein the one or more logic gates comprise:

a logical NOR gate configured to perform a logical NOR operation on the first input data bit on the first bitline and the second input data bit on the second bitline to detect the presence of the first input data bit on the first bitline and the second input data bit on the second bitline; and a logical NAND gate configured to perform a logical NAND operation on an output of the logical NOR gate and a boost enable control signal to activate or to deactivate the first switching element and the second switching element in response thereto.

14. The boost circuitry of claim 8, wherein the first switching element and the second switching element comprise:

a plurality of transmission gates.

15. The boost circuitry of claim 14, wherein the one or more logic gates comprise:

a logical NOR gate configured to perform a logical NOR operation on the first input data bit on the first bitline and the second input data bit on the second bitline to detect the presence of the first input data bit on the first bitline and the second input data bit on the second bitline; and a logical NAND gate configured to perform a logical NAND operation on an output of the logical NOR gate and a boost enable control signal to activate or to deactivate the first switching element and the second switching element in response thereto.

16. A method for operating a memory storage device, the method comprising:

deactivating a memory cell of the memory storage device;

providing an input data bit to a bitline of the memory storage device;

coupling the bitline to a data line of the memory storage device to pass the input data bit on the bitline to the data line;

adjusting a potential of the input data bit on the data line to be a potential of the input data bit on the bitline; and reading the input data bit on the data line to provide an output data bit.

17. The method of claim 16, wherein the adjusting comprises:

pulling-down a voltage of the input data bit on the data line to be a voltage of the input data bit on the bitline.

18. The method of claim 16, wherein the adjusting comprises:

pulling-up a voltage of the input data bit on the data line to be a voltage of the input data bit on the bitline.

19. The method of claim 16, further comprising:

activating the memory cell of the memory storage device;

coupling the bitline to the data line to pass a stored data bit from the memory cell to the data line; and reading the stored data bit on the data line to provide the output data bit.

20. The method of claim 16, further comprising:

activating the memory cell of the memory storage device;

decoupling the bitline from the data line; and providing the input data bit to the bitline for storage into the memory cell.

* * * * *